US009607706B1

(12) United States Patent
Chae et al.

(10) Patent No.: US 9,607,706 B1
(45) Date of Patent: Mar. 28, 2017

(54) SEMICONDUCTOR MEMORY DEVICE

(71) Applicant: SK hynix Inc., Gyeonggi-do (KR)

(72) Inventors: Kyeong Min Chae, Seoul (KR); Min Su Kim, Busan (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/138,943

(22) Filed: Apr. 26, 2016

(30) Foreign Application Priority Data

Nov. 27, 2015 (KR) .................. 10-2015-0167748

(51) Int. Cl.
| | |
|---|---|
| G11C 16/04 | (2006.01) |
| G11C 16/26 | (2006.01) |
| G11C 16/08 | (2006.01) |
| G11C 16/10 | (2006.01) |
| G11C 16/16 | (2006.01) |
| G11C 11/56 | (2006.01) |

(52) U.S. Cl.
CPC .......... *G11C 16/26* (2013.01); *G11C 16/0483* (2013.01); *G11C 16/08* (2013.01); *G11C 16/10* (2013.01); *G11C 16/16* (2013.01); *G11C 11/5628* (2013.01)

(58) Field of Classification Search
CPC ......... G11C 16/26; G11C 16/10; G11C 16/16; G11C 16/08; G11C 16/0483; G11C 11/5628
USPC .................................................. 365/185.12
See application file for complete search history.

(56) References Cited

U.S. PATENT DOCUMENTS

| | | | | |
|---|---|---|---|---|
| 6,912,598 B1 * | 6/2005 | Bedarida | ............ | G11C 16/26 365/189.04 |
| 7,290,109 B2 * | 10/2007 | Horii | ............ | G06F 13/1647 711/103 |
| 7,499,323 B2 * | 3/2009 | Park | ............ | G11C 7/1042 365/185.11 |
| 7,796,462 B2 * | 9/2010 | Pyeon | ............ | B60R 1/0617 365/189.05 |

FOREIGN PATENT DOCUMENTS

| | | |
|---|---|---|
| KR | 1019990023076 | 3/1999 |
| KR | 1020100050953 | 5/2010 |

* cited by examiner

*Primary Examiner* — Pho M Luu
(74) *Attorney, Agent, or Firm* — IP & T Group LLP

(57) ABSTRACT

A semiconductor memory device includes a first memory bank and a second memory bank; an address counter unit including: a first address counter suitable for outputting a first counting address signal corresponding to the first memory bank; and a second address counter suitable for outputting a second counting address signal corresponding to the second memory bank; a first output control unit suitable for generating first column address signals in response to the first counting address signal during a data input operation, and generating the first column address signals in response to the second counting address signal during a data output operation; and a second output control unit generating second column address signals in response to the second counting address signal during the data input operation and the data output operation.

20 Claims, 10 Drawing Sheets

SEMICONDUCTOR MEMORY DEVICE

CROSS-REFERENCE TO RELATED APPLICATION

The present application claims priority under 35 U.S.C. §119(a) to Korean patent application number 10-2015-0167748, filed on Nov. 27, 2015, the entire disclosure of which is incorporated herein by reference in its entirety.

BACKGROUND

Field of Invention

Various embodiments of the invention relate generally to an electronic device, and more particularly, to a semiconductor memory device.

Description of Related Art

Semiconductor memory devices may be classified into volatile memory devices and non-volatile memory devices.

Non-volatile memory devices operate at relatively lower write and read speeds than volatile memory devices, but they retain their stored data regardless of power on/off conditions. Therefore, non-volatile memory devices are used to store data which need to be maintained even in the absence of power supply. Examples of non-volatile memory include read only memory (ROM), mask ROM (MROM), programmable ROM (PROM), erasable programmable ROM (EPROM), electrically erasable and programmable ROM (EEPROM), flash memory, Phase-change random access memory (PRAM), magnetic RAM (MRAM), resistive RAM (RRAM) and ferroelectric RAM (FRAM). Flash memories are used widely and may be classified into NOR- or NAND-type memories.

Flash memories enjoy the advantages of both RAM and ROM devices. For example, flash memories may be freely programmed and erased similar to a RAM. Also similar to a ROM, flash memories may retain the stored data even when they are not powered. Flash memories have been widely used as the storage media of portable electronic devices, such as mobile phones, digital cameras, personal digital assistants (PDAs), and MP3 players.

SUMMARY

Various embodiments are directed to a semiconductor memory device capable of reducing power consumption during a data output operation.

According to an embodiment, a semiconductor memory device may include a first memory bank and a second memory bank; an address counter unit including: a first address counter suitable for outputting a first counting address signal corresponding to the first memory bank; and a second address counter suitable for outputting a second counting address signal corresponding to the second memory bank; a first output control unit suitable for generating first column address signals in response to the first counting address signal during a data input operation, and generating the first column address signals in response to the second counting address signal during a data output operation; and a second output control unit generating second column address signals in response to the second counting address signal during the data input operation and the data output operation.

According to an embodiment, a semiconductor memory device may include a memory cell array including a first memory bank and a second memory bank; a page buffer circuit suitable for reading data stored in the first and second memory banks and temporarily storing the data, and transferring the data to a data line in response to column selection signals; a data output circuit sensing the data transferred to the data line and storing the data, and transferring the data to an input/output line in response to pipe latch output signals; and a logic circuit including a first address counter and a second address counter corresponding to the first memory bank and the second memory bank, respectively, and suitable for generating the column selection signals based on a signal received from the second address counter during a data output operation.

DETAILED DESCRIPTION

Figure 1:
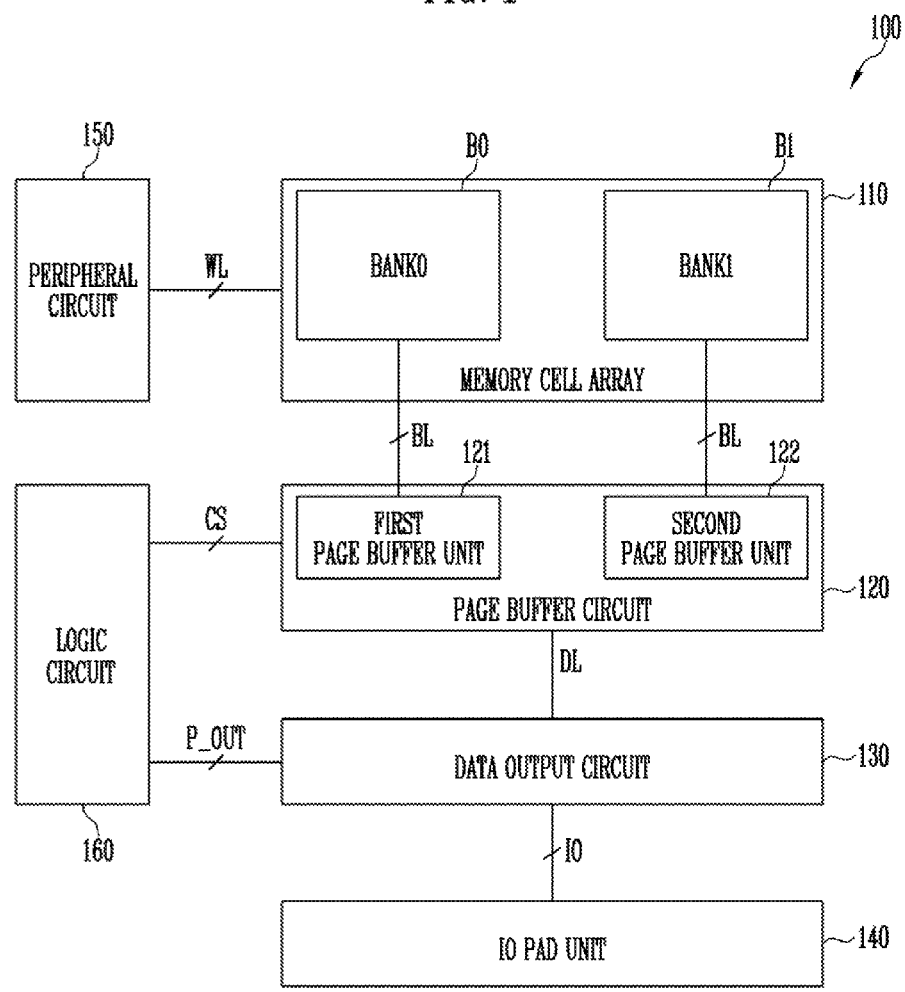
FIG. 1 is a block diagram illustrating a semiconductor memory device according to an embodiment of the invention.

Hereinafter, various exemplary embodiments of the invention will be described in detail with reference to the accompanying drawings. In the drawings, the dimensions of components may be exaggerated for convenience of illustration. In the following description, a detailed explanation of well-known and or related functions, structures and constitutions may be omitted for simplicity and conciseness. Like reference numerals refer to like elements throughout the specification and drawings.

It is also noted that in this specification, "connected/coupled" refers to one component not only directly coupling another component but also indirectly coupling another component through an intermediate component. Furthermore, 'include/comprise' or 'including/comprising' used in the specification represents that one or more components, steps, operations and elements exists or are added.

Referring now to FIG. 1 a block diagram illustrating a semiconductor memory device 100, according to an embodiment of the invention, is provided.

The semiconductor memory device 100, according to FIG. 1, may include a memory cell array 110, a page buffer circuit 120, a data output circuit 130, an input/output IO pad unit 140, a peripheral circuit 150 and a logic circuit 160.

The memory cell array 110 may include first and second memory banks B0 and B1. The memory cell array 110 including the first and second memory banks B0 and B1 may be identified as a single memory plane PLANE.

Each of the first and second memory banks B0 and B1 may include a plurality of memory blocks (not illustrated). The plurality of memory blocks may each include a plurality of pages, each page being coupled to the peripheral circuit 150 through a word line WL. Hence, the peripheral circuit 150 may be coupled electrically via a plurality of word lines to respective pages of the memory array 110. In addition, the plurality of memory blocks may be coupled to the buffer circuit 120 through a plurality of respective bit lines BL. Each of the plurality of memory blocks may include a plurality of memory strings. Each of the plurality of memory strings may include a drain selection transistor, a plurality of memory cells, and a source selection transistor which are coupled in series between a bit line and a source line. According to an embodiment, the plurality of memory cells may be non-volatile memory cells, such as flash memory cells. The plurality of memory cells may be charge trap memory cells.

The page buffer circuit 120 may include a first and second page buffer units 121 and 122. The first page buffer unit 121 may correspond to the first memory bank B0 and the second page buffer unit 122 may correspond to the second memory bank B1.

Each of the first page buffer unit 121 and the second page buffer unit 122 may include a plurality of page buffers (not illustrated). Each of the plurality of page buffers may be coupled to a respective bit line of the plurality of bit lines BL of the memory cell array 110.

The plurality of page buffers may store temporarily data to be stored in a selected memory cell. The plurality of page buffers may also read data stored in a selected memory cell and store temporarily the read data.

Each of the plurality of page buffers may output data stored temporarily therein to a respective data line selected among a plurality of data lines DL in response to a column selection signal CS during a data output operation.

The data output circuit 130 may perform a data output operation between the page buffer circuit 120 and the IO pad unit 140. The data output circuit 130 may include a sensing circuit for sensing data received from the page buffer circuit 120 and transfer the sensed data to the IO pad unit 140. The data output circuit 130 may further include a pipe latch circuit for storing temporality the data sensed by the sensing circuit. The data output circuit 130 may also output the data stored temporarily in the pipe latch. The sensing circuit and the pipe latch circuit will be further described below in more detail.

The IO pad unit 140 may include one or more pads PAD coupled to the outside of the semiconductor memory device 100. Any suitable IO pad may be used.

The peripheral circuit 150 may include any suitable circuits which operate in conjunction with the page buffer circuit 120 when reading data from a memory cell or storing data in a memory cell. For example, the peripheral circuit 150 may include a voltage generator and a row decoder. The voltage generator may generate operating voltages to be applied to memory cells during a general operation such as for including, for example, a program operation and a read operation. The row decoder may transfer the operating voltages generated by the voltage generator to memory cells on the basis of a row address which is received from an external device.

The logic circuit 160 may output a control signal CS to control operation of the page buffer circuit 120. The logic circuit 160 may also output a control signal P_OUT to control the data output circuit 130 to perform a data output operation.

Figure 2:
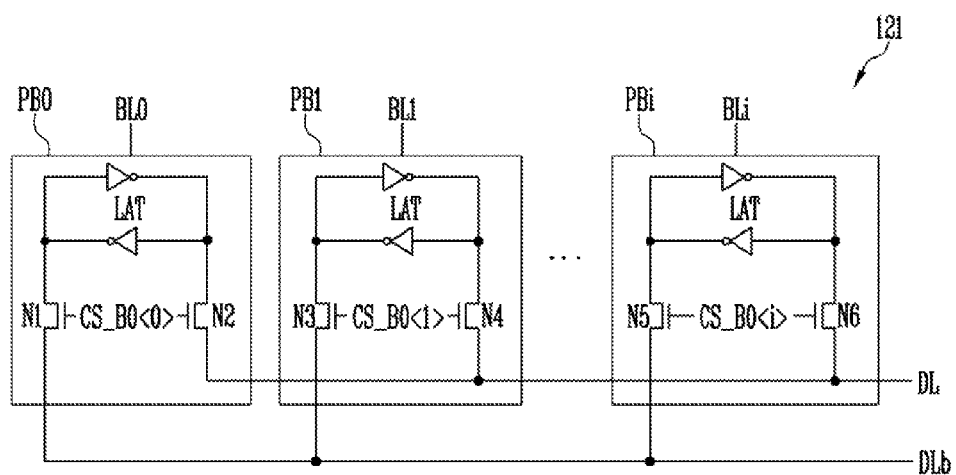
FIG. 2 is a circuit diagram illustrating an example configuration of a first page buffer unit of the semiconductor memory device shown in FIG. 1.

FIG. 2 provides an example circuit diagram for the first page buffer unit 121 of FIG. 1.

The first and second page buffer units 121 and 122 as shown in FIG. 1 may have the same configuration.

The first page buffer unit 121 may include a plurality of page buffers PB0 to PBi.

Each of the page buffers PB0 to PBi may be coupled to a respective bit line of the plurality of bit lines BL0 to BLi, and output read data sensed in a read operation to a respective data line pair (DL and DLb) in response to a corresponding first column selection signal among a plurality of first column selection signals CS_B0<i:0>. The first and second column selection signals CS_B0<i:> and CS_B1<i:> may correspond to the first and second memory banks B0 and B1, respectively.

Each of the plurality of page buffers PB0 to PBi may include a latch LAT which stores the read data and a data output unit (e.g., N1 or N2) which transfers the data stored in the latch LAT to the data line pair (DL and DLb).

Figure 3:
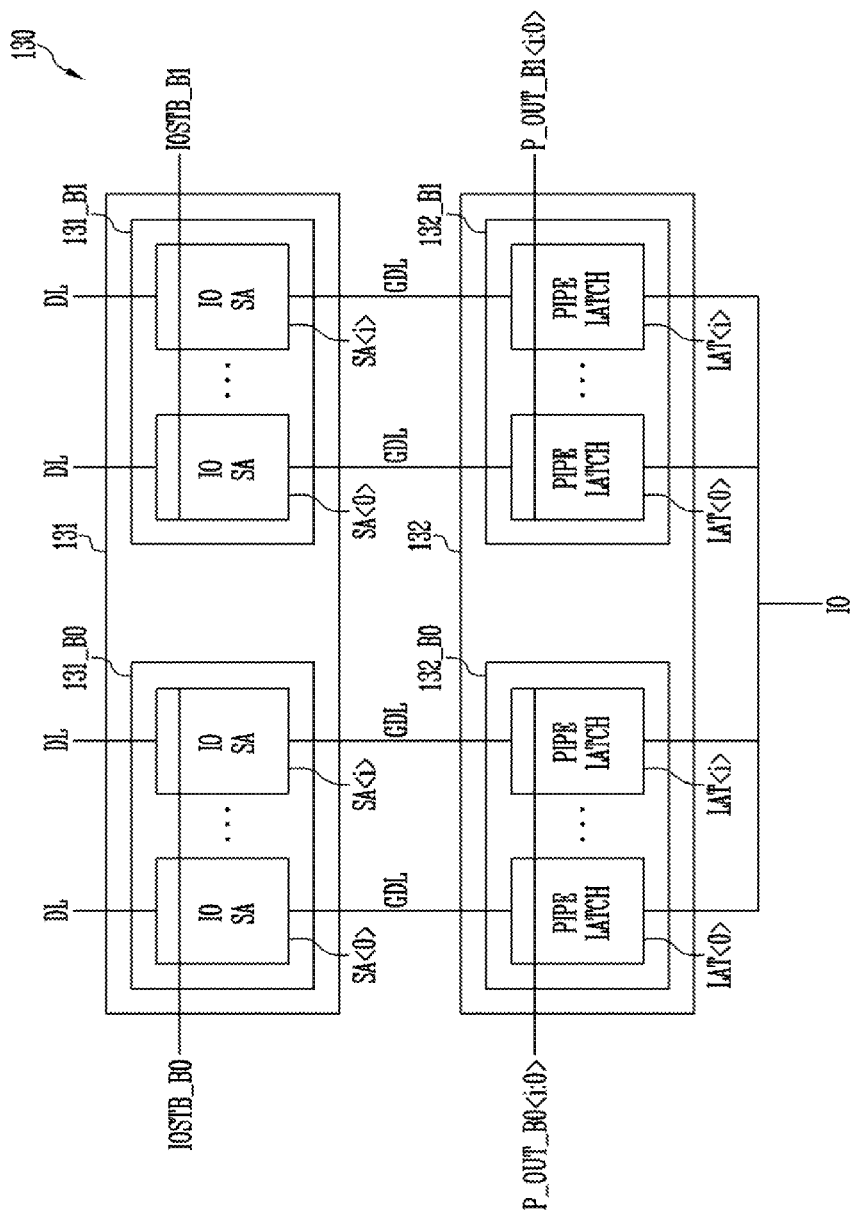
FIG. 3 is a block diagram illustrating an example configuration of a data output circuit of the semiconductor memory device shown in FIG. 1.

Referring now to FIG. 3 a block diagram illustrating an example configuration of the data output circuit 130 shown in FIG. 1 is provided.

The data output circuit 130 may include a sensing circuit 131 and a pipe latch circuit 132.

The sensing circuit 131 may be coupled to the data lines DL which are coupled to the page buffer circuit 120 as shown in FIG. 1. The sensing circuit 131 may sense potential levels of the data lines DL in response to first and second strobe signals IOSTB_B0 and IOSTB_B1 and receive data. The first and second strobe signals IOSTB_B0 and IOSTB_B1 may correspond to the first and second memory banks B0 and B1, respectively.

The sensing circuit 131 may include a first sensing group 131_B0 corresponding to the first memory bank B0 and a second sensing group 131_B1 corresponding to the second memory bank B1. Each of the first and second sensing groups 131_B0 and 131_B1 may include a plurality of sensing units SA<i:0>.

The plurality of sensing units SA<i:0>may be coupled between the data lines DL and global data lines GDL. The plurality of sensing units SA<i:0> may sense the potential levels of the data lines DL to latch sensing data in response to the first and second strobe signals IOSTB_B0 and IOSTB_B1. The plurality of sensing units SA<i:0> may transfer the sensing data to the global data lines GDL. The first and second strobe signals IOSTB_B0 and IOSTB_B1 may correspond to the first and second memory banks B0 and B1, respectively.

The pipe latch circuit 132 may be coupled to the sensing circuit 131 through the global data lines GDL, and output the data stored in the pipe latch circuit 132 to an input/output line IO in response to first and second pipe data output signals P_OUT_B0<i:0> and P_OUT_B1<i:0>. The first and second pipe data output signals P_OUT_B0<i:0> and P_OUT_B1<i:0> may correspond to the first and second memory banks B0 and B1, respectively.

The pipe latch circuit 132 may include a first pipe latch group 132_B0 corresponding to the first memory bank B0 and a second pipe latch group 132_B1 corresponding to the second memory bank B1. Each of the first and second pipe latch groups 132_B0 and 132_B1 may include a plurality of pipe latches LAT<i:0>.

Data read from the first memory bank B0 may be stored temporarily in the plurality of pipe latches LAT<i:0> included in the first pipe latch group 132_B0. The plurality of pipe latches LAT<i:0> included in the second pipe latch group 132_B1 may store temporarily data read from the second memory bank B1.

The plurality of pipe latches LAT<i:0> included in the first pipe latch group 132_B0 may output the temporarily stored data to the input/output line IO in response to the pipe data output signals P_OUT_B0<i:0>. The plurality of pipe latches LAT<i:0> stored in the second pipe latch group 132_B1 may output the temporarily stored data to the input/output line IO in response to the data output signals P_OUT_B1<i:0>.

Figure 4:
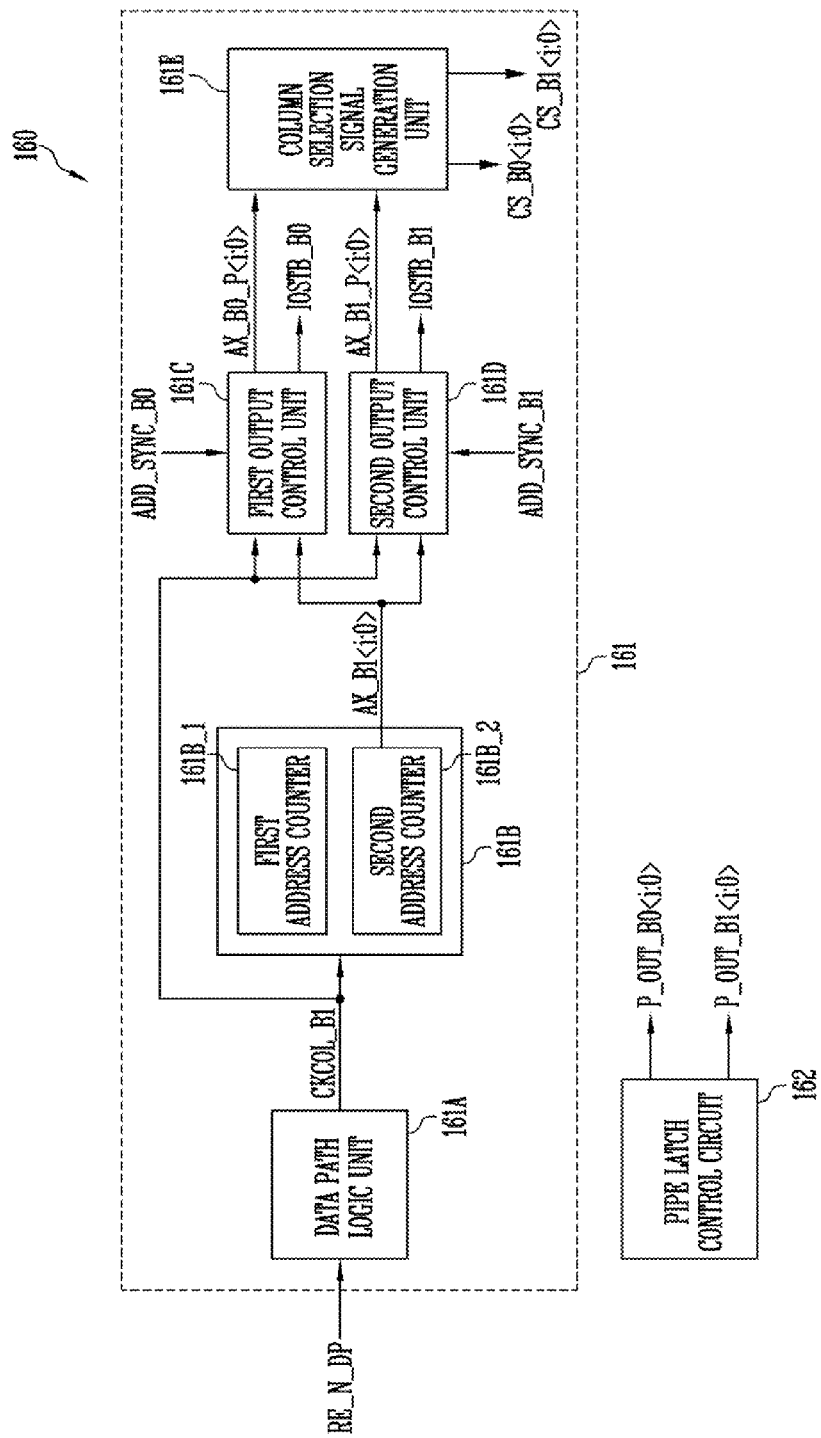
FIG. 4 is a block diagram illustrating an example configuration of a logic circuit of the semiconductor memory device shown in FIG. 1.

FIG. 4 is a block diagram illustrating an example configuration of the logic circuit 160 shown in FIG. 1.

Referring to FIG. 4, the logic circuit 160 may include a page buffer control circuit 161 and a pipe latch control circuit 162.

The page buffer control circuit 161 may generate and output first and second column selection signals CS_B0<i:0> and CS_B1<i:0> and first and second strobe signals IOSTB_B0 and IOSTB_B1 to transfer the data stored in the page buffer circuit 120 to the sensing circuit 131 during a data output operation.

The page buffer control circuit 161 may include a data path logic unit 161A, an address counter unit 161B, first and second output control units 161C and 161D and a column selection signal generation unit 161E.

The data path logic unit 161A may generate a source clock CKCOL_B1 in response to a data path enable signal RE_N_DP during the data output operation. The source clock CKCOL_B1 may correspond to the second memory bank B1.

The data path logic unit 161A may generate a first source clock CKCPL_B0 corresponding to the first memory bank B0. The data path logic unit 161A may generate a second source clock CKCOL_B1 corresponding to the second memory bank B1 during the data input operation.

The data path logic unit 161A may generate a single source clock, for example the second source clock CKCOL_B1, during the data output operation. This will be described below. The first source clock CKCOL_B0 and the second source clock CKCOL_B1 may toggle a predetermined number of times during a data prefetch operation prior to the data output operation so that as many column addresses as the predetermined number of times may be generated during the data prefetch operation, which allows the semiconductor memory device 100 to perform the data output operation at a high speed.

The address counter unit 161B may include a first address counter 161B_1 corresponding to the first memory bank B0 and a second address counter 161B_2 corresponding to the second memory bank B1.

The first address counter 161B_1 may generate a first counting addresses AX_B0<i:0> corresponding to the first memory bank B0 in response to the first source dock CKCPL_B0 received from the data path logic unit 161A during the data input operation. The first address counter 161B_1 may stop performing a counting operation and be disabled during the data output operation.

The second address counter 161B_2 may output a second counting addresses AX_B1<i:0> corresponding to the second memory bank B1 in response to the second source clock CKCOL_B1 received from the data path logic unit 161A during the data input operation and the data output operation.

The first output control unit 161C may generate first column address signals AX_B0_P<i:0> in response to the counting addresses received from the first address counter 161B_1 during the data input operation.

The first output control unit 161C may generate first column address signals AX_B0_P<i:0> and the first strobe signals IOSTB_B0 in response to the second counting addresses AX_B1<i:0> received from the second address counter 161B_2 during the data output operation. The first output control unit 161C may generate the first column address signals AX_B0_P<i:0> by synchronizing the counting addresses received from the first address counter 161B_1 and the second counting addresses AX_B1<i:0> received from the second address counter 161B_2 with an first address synchronization signal ADD_SYNC_B0.

The second output control unit 161D may generate second column address signals AX_B1_P<i:0> and the second strobe signals IOSTB_B1. In response to the second counting addresses AX_B1<i:0> received from the second address counter 161B_2 during the data input operation and the data output operation. The second output control unit 161D may generate the second column address signals AX_B1_P<i:0> by synchronizing the second counting addresses AX_B1<i:0> received from the second address counter 161B_2 with a second address synchronization signal ADD_SYNC_B1.

The column selection signal generation unit 161E may generate first and second column selection signals CS_B0<i:0> and CS_B1<i:0> in response to the first and second column address signals AX_B0_P<i:0> and AX_B1_P<i:0> received from the first output control unit 161C and the second output control unit 161D, and output the first and second column selection signals CS_B0<i:0> and CS_B1<i:0> to the page buffers.

The pipe latch control circuit 162 may generate and output the first and second pipe data output signals P_OUT_B0<i:0> and P_OUT_B1<i:0> to output the data stored in the pipe latch circuit 132 to the input/output line IO during the data output operation.

Figure 5:
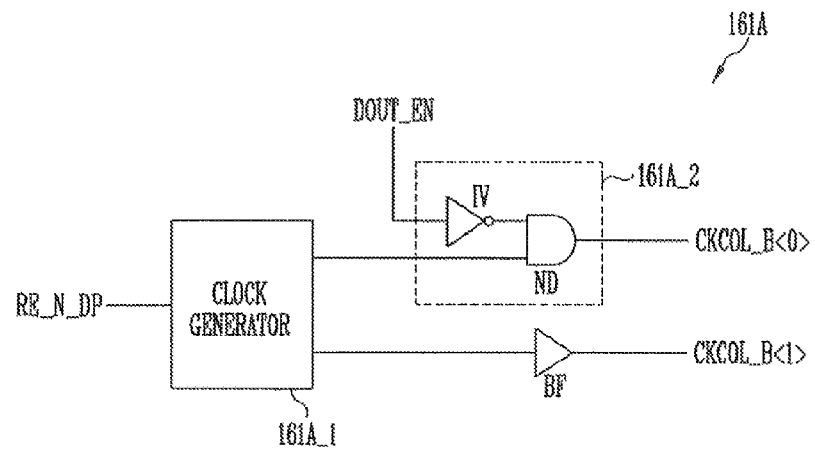
FIG. 5 is a block diagram illustrating an example configuration of the data path logic unit of the logic circuit shown in FIG. 4.

FIG. 5 is a block diagram illustrating an example configuration of the data path logic unit 161A shown in FIG. 4.

Referring to FIG. 5, the data path logic unit 161A may generate the first source clock CKCOL_B<0> corresponding to the first memory bank B0 and the second source clock CKCOL_B<1> corresponding to the second memory bank B1 in response to the data path enable signal RE_N_DP during the data input operation.

In addition, the data path logic unit 161A may generate the second source clock CKCOL_B<1> corresponding to the second memory bank B1 in response to the data path enable signal RE_N_DP during the data output operation.

The data path logic unit 161A may include a clock generator 161A_1, a first output buffer 161A_2 and a second output buffer BF.

The clock generator 161A_1 may generate a clock signal which has a predetermined cycle in response to the data path enable signal RE_N_DP.

The first output buffer 161A_2 may generate the source clock CKCOL_B<0> in response to the clock signal received from the clock generator 161A_1, and be disabled in response to a data output enable signal DOUT_EN which is enabled during the data output operation. Therefore, the clock generator 161A_1 may not generate the first source clock CKCOL_B<0> in response to the data output enable signal DOUT_EN during the data output operation.

The first output buffer 161A_2 may include an inverter IV and a NAND gate. The inverter IV may receive, invert and output the data output enable signal DOUT_EN. The NAND gate may perform a logical operation of an output signal from the inverter IV and the clock signal received from the clock generator 161A_1 to generate the first source clock CKCOL_B<0>. The first output buffer 161A_2 may maintain the first source clock CKCOL_B<0> at a high logic level in response to the data output enable signal DOUT_EN during the data output operation.

The second output buffer BF may buffer a clock signal received from the clock generator 161A_1 and output the second source clock CKCOL_B<1> during the data input operation and the data output operation.

Figure 6:
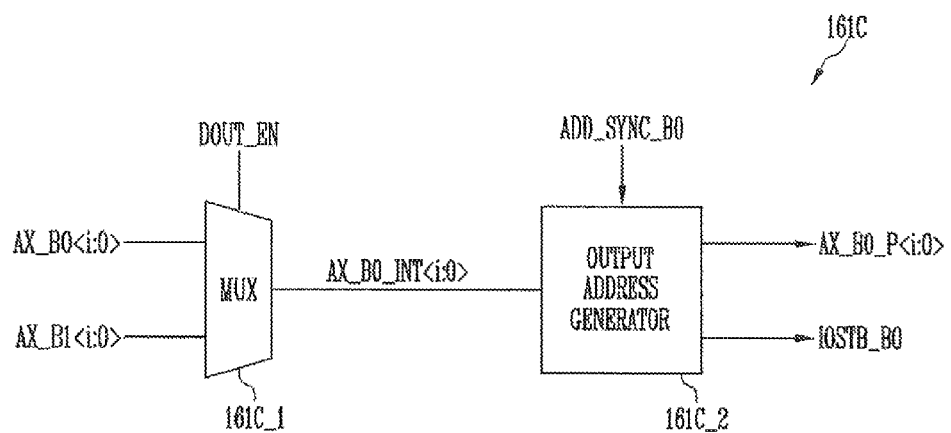
FIG. 6 is a block diagram illustrating an example configuration of the first output control unit of the logic circuit shown in FIG. 4.

FIG. 6 is a block diagram illustrating an example configuration of the first output control unit 161C shown in FIG. 4.

Referring to FIG. 6, the first output control unit 161C may generate the first column address signals AX_B0_P<i:0> in response to the first counting addresses AX_B0<i:0> corresponding to the first memory bank B0 during the data input operation.

The first output control unit 161C may generate the first column address signals AX_B0_P<i:0> and the first strobe signals IOSTB_B0 in response to the second counting addresses AX_B1<i:0> corresponding to the second memory bank B0 and output from the second address counter 161B_2 during the data output operation.

The first output control unit 161C may include an address selection portion 161C_1 and an output address generator 161C_2.

The address selection portion 161C_1 may output as an internal counting addresses AX_B0_INT<i:0> one of the first counting addresses AX_B0<i:0> corresponding to the first memory bank B0 and the second counting addresses AX_B1<i:0> corresponding to the second memory bank B1 in response to the data output enable signal DOUT_EN. For example, the address selection portion 161C_1 may output the first counting addresses AX_B0<i:0> as the internal counting addresses AX_B0_INT<i:0> in response to the data output enable signal DOUT_EN which is disabled during the data input operation while the address selection portion 161C_1 may output the second counting addresses AX_B1<i:0> as the internal counting addresses AX_B0_INT<i:0> in response to the data output enable signal DOUT_EN which is enabled during the data output operation. The address selection portion 161C_1 may include a multiplexer MUX.

The output address generator 161C_2 may generate the first column address signals AX_B0_P<i:0> in response to the internal counting addresses AX_B0_INT<i:0> during the data input operation. The output address generator 161C_2 may generate the first column address signals AX_B0_P<i:0> and the first strobe signals IOSTB_B0 in response to the internal counting addresses AX_B0_INT<i:0> during the data output operation. The output address generator 161C_2 may generate the first column address signals AX_B0_P<i:0> by synchronizing the internal counting addresses AX_B0_INT<i:0> with an first address synchronization signal ADD_SYNC_B0.

Figure 7:
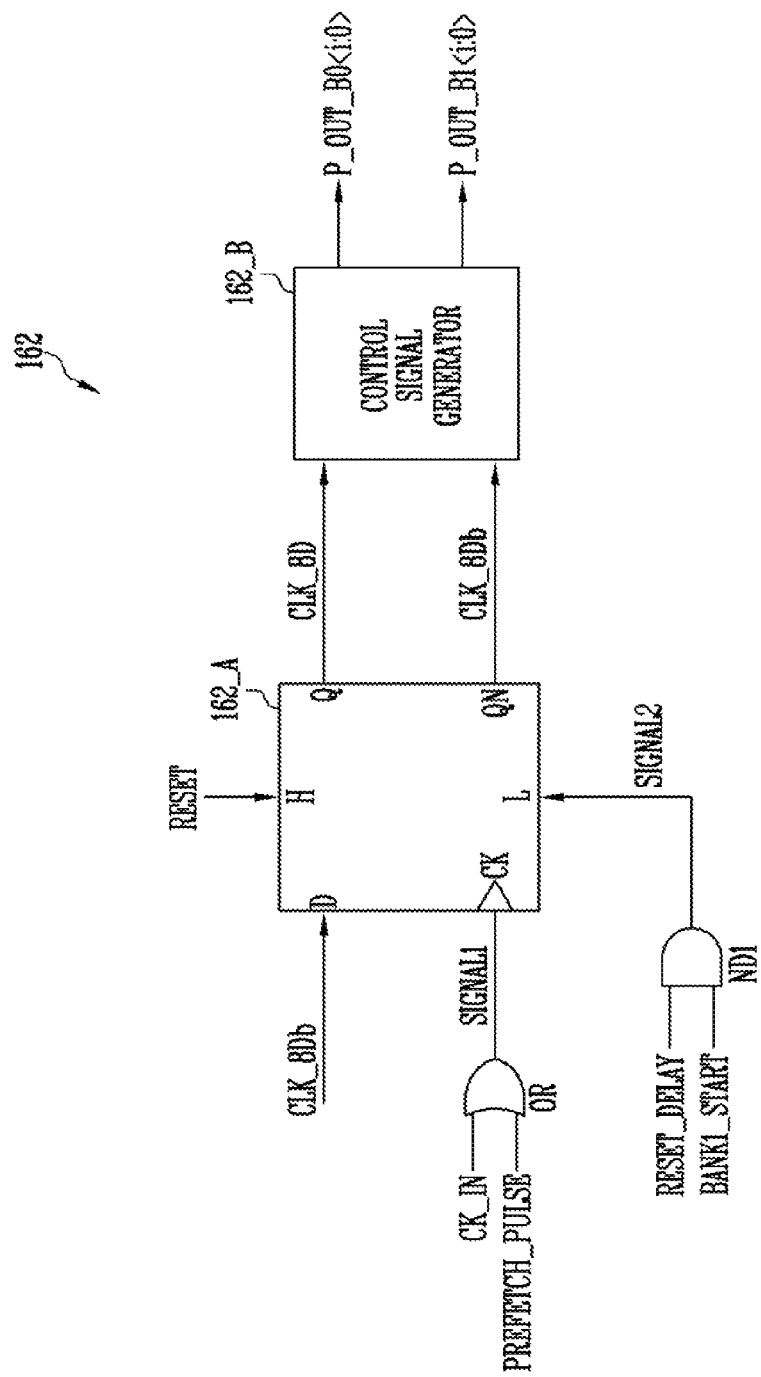
FIG. 7 is a block diagram illustrating an example configuration of the pipe latch control circuit of the logic circuit shown in FIG. 4.

FIG. 7 is a block diagram illustrating an example configuration of the pipe latch control circuit 162 shown in FIG. 4.

Referring to FIG. 7, the pipe latch control circuit 162 may include an OR gate OR, a NAND gate ND1, a clock generator 162_A and a control signal generator 162_B.

The OR gate OR may generate an output signal SIGNAL1 in response to a clock input signal CK_IN and a prefetch signal PREFETCH_PULSE. The NAND gate ND1 may generate an output signal SIGNAL2 in response to a delay reset signal RESET_DELAY and a first bank start signal BANK1_START. The prefetch signal PREFETCH_PULSE may allow the pipe latch circuit 132 to output garbage data to the input/output line IO according to the first and second pipe data output signals P_OUT_B0<i:0> and P_OUT_B1<i:0>, which are generated according to toggled control clock CLK_8D during a data prefetch operation before the data output operation, which will be described with reference to FIG. 9. The delay reset signal RESET_DELAY may be obtained by delaying a reset signal RESET by a predetermined amount of time. The bank start signal BANK1_START may determine the order of data output between the first memory bank B0 and the second memory bank B1 during the data output operation. For example, when the bank start signal BANK1_START has a low level, data of the first and second memory banks B0 and B1 may be alternately outputted from the first and second memory banks B0 and B1, starting with the first memory bank first. When the bank start signal BANK1_START has a high level, data of the first and second memory banks B0 and B1 may be alternately outputted from the second and first memory banks B1 and B0 starting with the second memory bank B1 first.

The clock generator 162_A may internally output a control clock CLK_8D having a predetermined cycle in response to the output signal SIGNAL1. More specifically, the clock generator 162_A may be composed of a flip-flop. The clock generator 162_A may receive the output signal SIGNAL1 at its clock terminal CK, and an inverting control clock CLK_8Db at its input terminal D. Therefore, the clock generator 162_A may generate the control clock CLK_8D. In addition, the clock generator 162_A may initialize the control clock CLK_8D to a high logic level in response to the reset signal RESET, and output the control clock CLK_8D at a low logic level in response to the output signal SIGNAL2.

The control signal generator 162_B may generate the first and second pipe data output signals P_OUT_B0<i:0> and P_OUT_B1<i:0> in response to the control clock CLK_8D.

Figure 8:
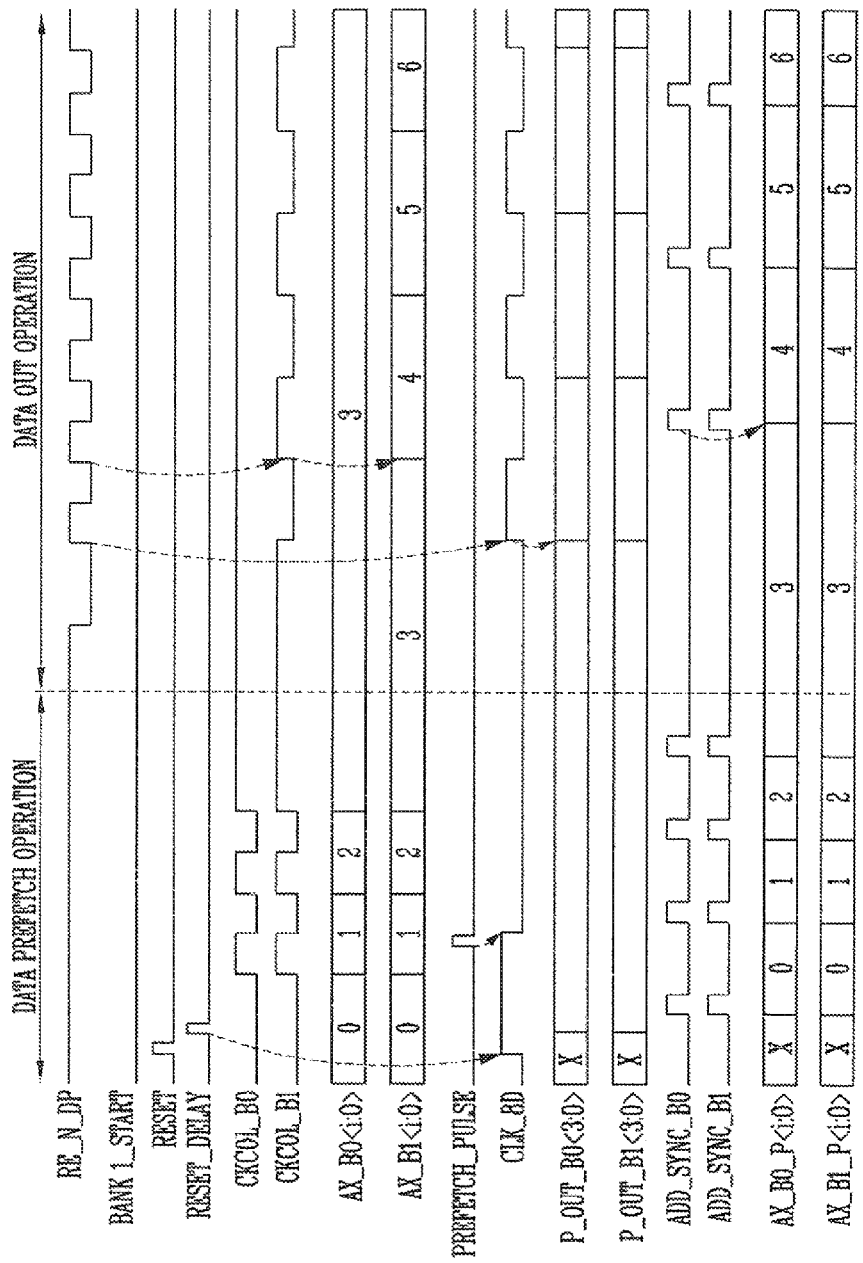
FIG. 8 is a waveform diagram of signals illustrating a data output method of a semiconductor memory device according to an embodiment of the invention.

FIG. 8 is a waveform diagram of signals illustrating a data output method of a semiconductor memory device according to an embodiment of the invention.

A data output operation of a semiconductor memory device is described below with reference to FIGS. 1 to 8, according to an embodiment of the invention.

Accordingly, during a data output operation of the semiconductor memory device 100, data of the first and second memory banks B0 and B1 may be alternately outputted from the first and second memory banks B0 and B1.

The data prefetch operation DATA PREFETCH OPERATION may be performed before the data output operation DATA OUTPUT OPERATION, so that predetermined numbers of the first and second column address signals AX_B0_P<i:0> and AX_B1_P<i:0> (0, 1, 2, 3) may be generated. This will be described below in more detail.

During the data prefetch operation DATA PREFETCH OPERATION, the clock generator 162_A of the pipe latch control circuit 162 may be initialized to output the control clock CLK_8D at a high level in response to the reset signal RESET. Subsequently, the clock generator 162_A may transition the control clock CLK_8D from the high level to a low level in response to the prefetch pulse signal PREFETCH_PULSE.

The data path logic unit 161A may output the first and second source clocks CKCOL_B0 and CKCOL_B1 which may toggle a predetermined number of times during the data prefetch operation DATA PREFETCH OPERATION. The address counter unit 161B may generate and output predetermined numbers of the first and second counting addresses AX_B0<i:0> and AX_B1<i:0> (0, 1, 2, 3) in response to the first and second source clocks CKCOL_B0 and CKCOL_B1.

The first output control unit 161C may synchronize the first counting addresses AX_B0<i:0> (0, 1, 2, 3) received from the first address counter 161B_1 with the first address synchronization signal ADD_SYNC_B0 and generate predetermined numbers of the first column address signals AX_B0_P<i:0> (0, 1, 2, 3).

The second output control unit 161D may synchronize the second counting addresses AX_B1<i:0> (0, 1, 2, 3) received from the second address counter 161B_2 with the second address synchronization signal ADD_SYNC_B1 and generate predetermined numbers of the second column address signals AX_B1_P<i:0> (0, 1, 2, 3) as the predetermined number.

The column selection signal generation unit 161E may generate and output the first and second column selection signals CS_B0<i:0> and CS_B1<i:0> to the page buffers in response to the first and second column address signals AX_B0_P<i:0> and AX_B1_P<i:0> (0, 1, 2, 3) received from the first output control unit 161C and the second output control unit 161D.

Since the predetermined numbers of the first and second column address signals AX_B0_P<i:0>, AX_B1_P<i:0> (0, 1, 2, 3) and the first and second column selection signals CS_B0<i:0> and CS_B1<i:0> are generated during the data prefetch operation DATA PREFETCH OPERATION, some of the data read from the first and second memory banks B0 and B1 and stored in the page buffers may be stored in the data output circuit 130.

After the data prefetch operation DATA PREFETCH OPERATION is completed, the data output operation DATA OUT OPERATION may be performed.

During the data output operation, the data path logic unit 161A may generate the second source clock CKCOL_B<1> corresponding to the second memory bank B1 in response to the data path enable signal RE_N_DP.

The first address counter 161B_1 of the address counter unit 161B may be disabled during the data output operation to reduce power consumption.

The second address counter 161B_2 may output counting addresses AX_B1<i:0> (4, 5, 6) in response to the source clock CKCOL_B1. The second counting addresses AX_B1<i:0> (4, 5, 6) generated during the data output operation DATA OUTPUT OPERATION may be the ones subsequent to the second counting addresses AX_B1<i:0> (0, 1, 2, 3) generated during the data prefetch operation DATA PREFETCH OPERATION.

The first output control unit 161C may generate the first column address signals AX_B0_P<i:0> (4, 5, 6) and the first strobe signals IOSTB_B0 in response to the second counting addresses AX_B1<i:0> (4, 5, 6) received from the second address counter 161B_2. The first output control unit 161C may synchronize the second counting addresses AX_B1<i: 0> (4, 5, 6) received from the second address counter 161B_2 with the first address synchronization signal ADD_SYNC_B0 to generate the first column address signals AX_B0_P<i:0> (4, 5, 6).

The second output control unit 161D may generate the second column address signals AX_B1_P<i:0> (4, 5, 6) and the second strobe signals IOSTB_B1 in response to the second counting addresses AX_B1<i:0> (4, 5, 6) received from the second address counter 161B_2. The second output control unit 161D may synchronize the second counting addresses AX_B1<i:0> (4, 5, 6) with the second address synchronization signal ADD_SYNC_B1 to generate the second column address signals AX_B1_P<i:0> (4, 5, 6).

The column selection signal generation unit 161E may generate and output the first and second column selection signals CS_B0<i:0> and CS_B1<i:0> to the page buffer circuit 120 in response to the first and second column address signals AX_B0_P<i:0> and AX_B1_P<i:0> (4, 5, 6) received from the first output control unit 161C and the second output control unit 161D.

The page buffer circuit 120 may transfer the data read and stored from the first memory bank B0 and the second memory bank B1 to the data lines DL in response to the first and second column selection signals CS_B0<i:0> and CS_B1<i:0>.

The sensing circuit 131 of the data output circuit 130 may sense potential levels of the data lines DL and output the sensed data to the pipe latch circuit 132 in response to the first and second strobe signals IOSTB_B0 and IOSTB_B1.

The pipe latch circuit 132 may store the data transferred from the sensing circuit 131 and output the data stored therein to the input/output line IO in response to the first and second pipe data output signals P_OUT_B0<i:0> and P_OUT_B1<i:0>.

As described above, by disabling the first address counter 161B_1 of the address counter unit 161B during the data output operation DATA OUTPUT OPERATION, power consumption may be reduced.

Figure 9:
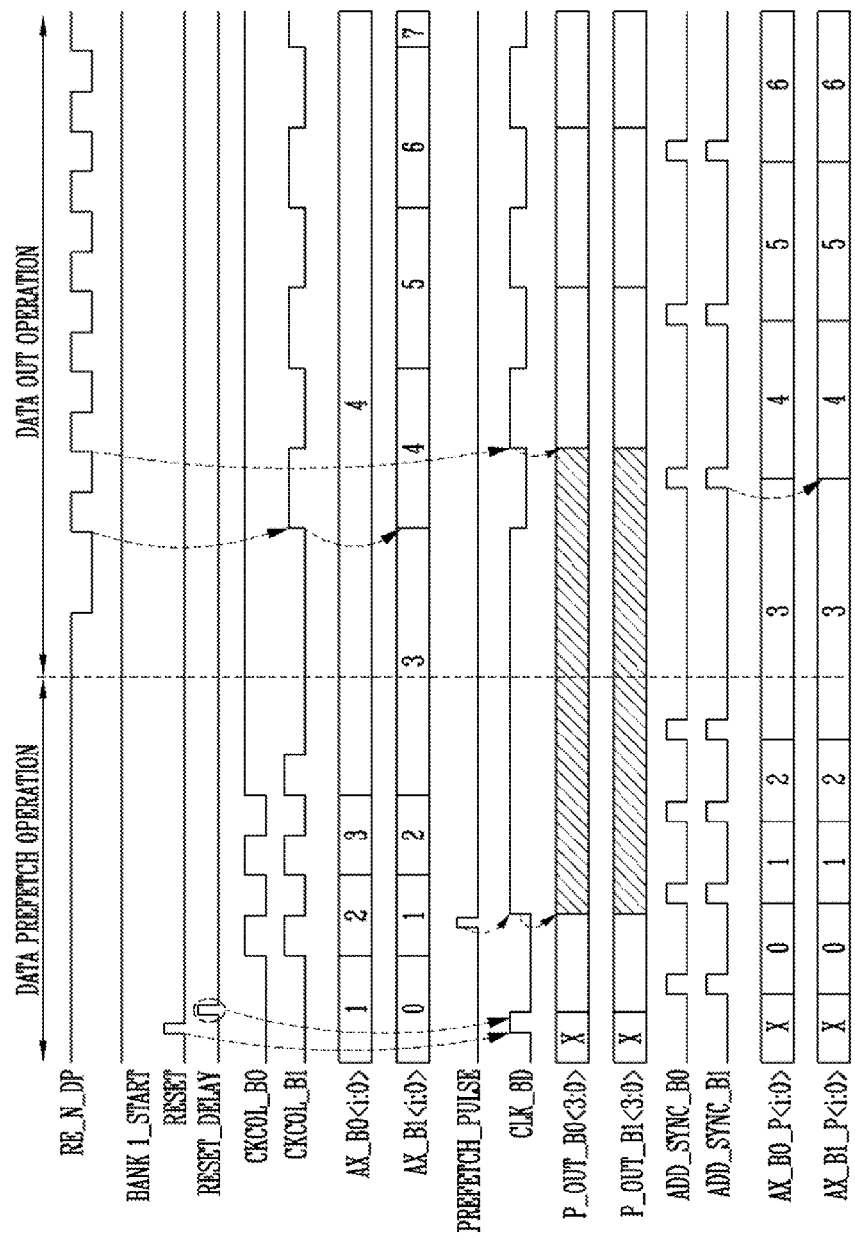
FIG. 9 is a waveform diagram of signals illustrating a data output method of a semiconductor memory device according to an embodiment of the invention.

FIG. 9 is a waveform diagram of signals for illustrating a data output method of a semiconductor device according to an embodiment.

A data output operation of a semiconductor memory device according to an embodiment is described below with reference to FIGS. 1 to 7 and 9.

According to an embodiment, data of the first and second memory banks B0 and B1 may be alternately outputted from the second and first memory banks B1 and B0, starting with the second memory bank first, during the data output operation of a semiconductor memory device 100.

The data prefetch operation DATA PREFETCH OPERATION may be performed before the data output operation DATA OUTPUT OPERATION, so that predetermined numbers of the first and second column address signals AX_B0_P<i:0> and AX_B1_P<i:0> (0, 1, 2, 3) may be generated. This will be described below in more detail.

During the data prefetch operation DATA PREFETCH OPERATION, the clock generator 162_A of the pipe latch control circuit 162 may output the control clock CLK_8D at a high level in response to the reset signal RESET. The control clock CLK_8D may transition from the high level to a low level in response to the delay reset signal RESET_DELAY, which toggles after the reset signal RESET by a predetermined period of time, and the first bank start signal BANK1_START of a high level. Subsequently, the clock generator 162_A may transition the control clock CLK_8D from the low level to a high level in response to the prefetch pulse signal PREFETCH_PULSE. As a result the control clock CLK_8D may toggle from high level to a low level, and then to a high level during the data prefetch operation DATA PREFETCH OPERATION.

The control signal generator 162_B may generate the first and second pipe data output signals P_OUT_B0<i:0> and P_OUT_B1<i:0> (represented by slash in FIG. 9) in response to the control clock CLK_8D, which toggles during the data prefetch operation DATA PREFETCH OPERATION. Therefore, the data output operation may be performed in response to the first and second pipe data output signals P_OUT_B0<i:0> and P_OUT_B1<i:0> posterior to the first and second pipe data output signals P_OUT_B0<i:0> and P_OUT_B1<i:0> generated during the data prefetch operation DATA PREFETCH OPERATION. The data to be output according to the first and second pipe data output signals P_OUT_B0<i:0> and P_OUT_B1<i:0> generated during the data prefetch operation DATA PREFETCH OPERATION may be preferably garbage data stored in the pipe latch circuit 132. Due to the first and second pipe data output signals P_OUT_B0<i:0> and P_OUT_B1<i:0> generated during the data prefetch operation DATA PREFETCH OPERATION, the data firstly received from the first memory bank B0 may be the garbage data when the second memory bank B1 is the start memory bank, and thus the garbage data may not be output but skipped during the data output operation DATA OUT OPERATION, which will be described in more detail.

The data path logic unit 161A may output the first and second source clocks CKCOL_B0 and CKCOL_B1 which toggle a predetermined number of times during the data prefetch operation DATA PREFETCH OPERATION. The address counter unit 161B may generate and output predetermined numbers of the first and second counting addresses AX_B0<i:0> and AX_B1<i:0> in response to the first and second source clocks CKCOL_B0 and CKCOL_B1. Since the address counter unit 161B starts the data output operation to the second memory bank B1 prior to the first memory bank B0, the first counting addresses AX_B0<i:0> may be generated in order of "1, 2, 3 and 4" and the second counting addresses AX_B1<i:0> may be generated in order of "0, 1, 2 and 3" in order to skip a first data output operation of the first memory bank B0.

The first output control unit 161C may synchronize the first counting addresses AX_B0<i:0> (1, 2, 3, 4) received from the first address counter 161B_1 with the first address synchronization signal ADD_SYNC_B0 and generate predetermined numbers of the first column address signals AX_B0_P<i:0> (0, 1, 2, 3).

The second output control unit 161D may synchronize the second counting addresses AX_B1<i:0> (0, 1, 2, 3) received from the second address counter 161B_2 with the second address synchronization signal ADD_SYNC_B1 and generate predetermined numbers of the second column address signals AX_B1_P<i:0> (0, 1, 2, 3) as the predetermined number.

The column selection signal generation unit 161E may generate and output the first and second column selection signals CS_B0<i:0> and CS_B1<i:0> to the page buffers in response to the first and second column address signals AX_B0_P<i:0> and AX_B1_P<i:0> (0, 1, 2, 3) received from the first output control unit 161C and the second output control unit 161D.

Since the predetermined numbers of the first and second column address signals AX_B0_P<i:0>, AX_B1_P<i:0> (0, 1, 2, 3) and the first and second column selection signals CS_B0<i:0> and CS_B1<i:0> are generated during the data prefetch operation DATA PREFETCH OPERATION, some of the data read from the first and second memory banks B0 and B1 and stored in the page buffers may be stored in the data output circuit 130.

After the data prefetch operation DATA PREFETCH OPERATION is completed, the data output operation DATA OUT OPERATION may be performed.

During the data output operation, the data path logic unit 161A may generate the second source clock CKCOL_B<1> corresponding to the second memory bank B1 in response to the data path enable signal RE_N_DP.

The first address counter 161B_1 of the address counter unit 161B may be disabled during the data output operation to reduce power consumption.

The second address counter 161B_2 may output counting addresses AX_B1<i:0> (4, 5, 6, 7) in response to the source clock CKCOL_B1. The second counting addresses AX_B1<i:0> (4, 5, 6, 7) generated during the data output operation DATA OUTPUT OPERATION may be the ones subsequent to the second counting addresses AX_B1<i:0> (0, 1, 2, 3) generated during the data prefetch operation DATA PREFETCH OPERATION.

The first output control unit 161C may generate the first column address signals AX_B0_P<i:0> (4, 5, 6) and the first strobe signals IOSTB_B0 in response to the second counting addresses AX_B1<i:0> (4, 5, 6, 7) received from the second address counter 161B_2. The first output control unit 161C may synchronize the second counting addresses AX_B1<i:0> (4, 5, 6, 7) received from the second address counter 161B_2 with the first address synchronization signal ADD_SYNC_B0 to generate the first column address signals AX_B0_P<i:0> (4, 5, 6).

The second output control unit 161D may generate the second column address signals AX_B1_P<i:0> (4, 5, 6) and the second strobe signals IOSTB_B1 in response to the second counting addresses AX_B1<i:0> (4, 5, 6, 7) received from the second address counter 161B_2. The second output control unit 161D may synchronize the second counting addresses AX_B1<i:0> (4, 5, 6, 7) with the second address synchronization signal ADD_SYNC_B1 to generate the second column address signals AX_B1_P<i:0> (4, 5, 6).

The column selection signal generation unit 161E may generate and output the first and second column selection signals CS_B0<i:0> and CS_B1<i:0> to the page buffer circuit 120 in response to the first and second column address signals AX_B0_P<i:0> and AX_B1_P<i:0> (4, 5, 6) received from the first output control unit 161C and the second output control unit 161D.

The page buffer circuit 120 may transfer the data read and stored from the first memory bank B0 and the second memory bank B1 to the data lines DL in response to the first and second column selection signals CS_B0<i:0> and CS_B1<i:0>.

The sensing circuit 131 of the data output circuit 130 may sense potential levels of the data lines DL and output the sensed potential levels to the pipe latch circuit 132 in response to the first and second strobe signals IOSTB_B0 and IOSTB_B1.

The pipe latch circuit 132 may store the data transferred from the sensing circuit 131 and output the data stored therein to the input/output line IO in response to the first and second pipe data output signals P_OUT_B0<i:0> and P_OUT_B1<i:0>.

The first and second pipe data output signals P_OUT_B0<i:0> and P_OUT_B1<i:0> during the data output operation DATA OUT OPERATION may be subsequent to the first and second pipe data output signals P_OUT_B0<i:0> and P_OUT_B1<i:0> (represented by slash in FIG. 9) generated during the data prefetch operation DATA PREFETCH OPERATION. As described above, the first and second pipe data output signals P_OUT_B0<i:0> and P_OUT_B1<i:0> generated during the data prefetch operation DATA PREFETCH OPERATION may preferably correspond to the garbage data. The pipe latch circuit 132 may perform a subsequent data output operation according to the first and second pipe data output signals P_OUT_B0<i:0> and P_OUT_B1<i:0> during the data output operation DATA OUT OPERATION by skipping the garbage data corresponding to the first pipe data output signals P_OUT_B0<0> and P_OUT_B1<0> generated during the data prefetch operation DATA PREFETCH OPERATION.

As described above, by disabling first address counter 161B_1 of the address counter unit 161B during the data output operation, power consumption may be reduced.

Figure 10:
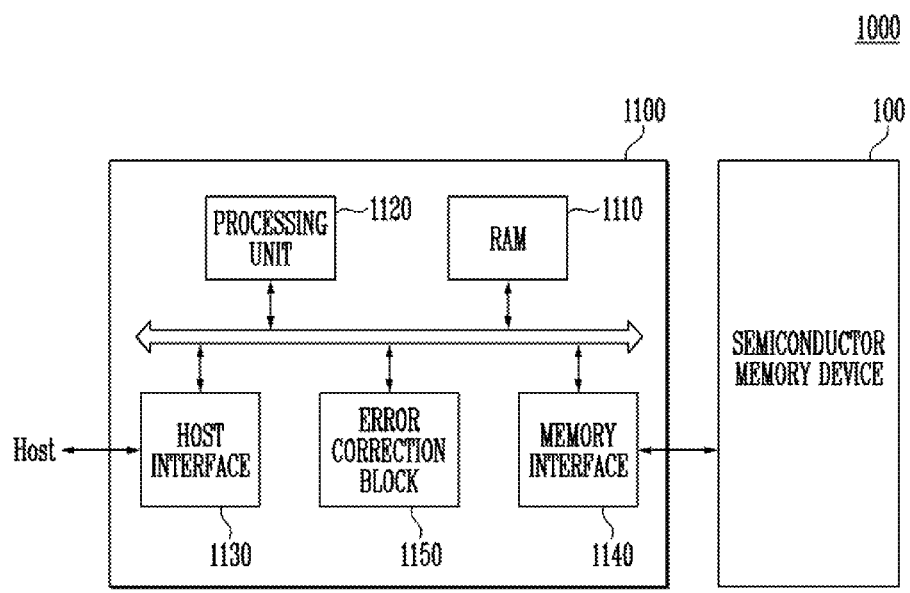
FIG. 10 is a block diagram illustrating a memory system including the semiconductor memory device shown in FIG. 1, according to an embodiment of the invention.

FIG. 10 is a block diagram illustrating a memory system 1000 including the semiconductor memory device shown in FIG. 1, according to an embodiment of the invention.

Referring to FIG. 10, the memory system 1000 may include the semiconductor memory device 100 and a controller 1100.

The semiconductor memory device 100 may be the same as the semiconductor memory device described above with reference to FIG. 1. A detailed description thereof will be omitted.

The controller 1100 may be coupled to a host and the semiconductor memory device 100. The controller 1100 may be configured to access the semiconductor memory device 100 at the request of the host. For example, the controller 1100 may control a read operation, a program operation, an erase operation, and/or a background operation of the semiconductor memory device 100. The controller 1100 may provide an interface between the semiconductor memory device 100 and the host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may be used as operation memory of the processing unit 1120, a cache memory between the semiconductor memory device 100 and the host, and/or a buffer memory between the semiconductor memory device 100 and the host. The processing unit 1120 may control operations of the controller 1100. In addition, the controller 1100 may store temporarily program data provided form the host during a write operation.

The host interface 1130 may include a protocol for exchanging data between the host and the controller 1100. For example, the controller 1100 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1140 may interface with the semiconductor memory device 100. For example, the memory interface may include a NAND flash interface or a NOR flash interface The error correction block 1150 may detect and correct errors in data read from the semiconductor memory device 100 by using an error correction code (ECC). The processing unit 1120 may control a read voltage based on an error detection result of the error correction block 1150 and perform a re-read operation. According to an embodiment, the error correction block may be provided as a component of the controller 1100.

The controller 1100 and the semiconductor memory device 100 may be integrated in a single semiconductor device. According to an embodiment, the controller 1100 and the semiconductor memory device 100 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1100 and the semiconductor memory device 100 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra-mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, and the like.

According to an exemplary embodiment, the semiconductor memory device 100 or the memory system 1000 may be packaged in various forms. For example, the semiconductor memory device 100 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), and the like.

Figure 11:
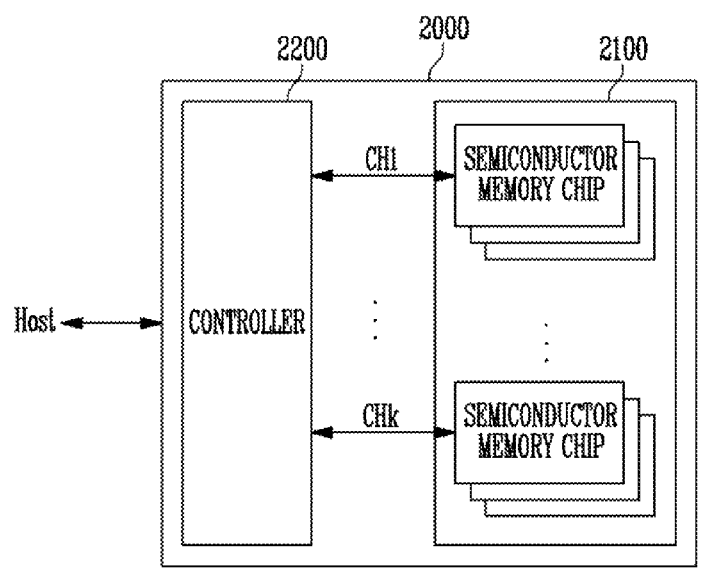
FIG. 11 is a block diagram illustrating an application of the memory system shown in FIG. 10, according to an embodiment of the invention.

FIG. 11 is a block diagram illustrating an application example (2000) of the memory system 1000 shown in FIG. 10.

Referring to FIG. 11, a memory system 2000 may include a semiconductor memory device 2100 and a controller 2200. The semiconductor memory device 2100 may include a plurality of semiconductor memory chips. The plurality of semiconductor memory chips may be divided into groups.

FIG. 11 illustrates the plurality of groups communicating with the controller 2200 through first to k-th channels CH1 to CHk. Each of the semiconductor memory chips may be configured and operated in substantially the same manner as the semiconductor memory device 100 described above with reference to FIG. 1.

Each group may communicate with the controller 2200 through a single common channel. The controller 2200 may be configured in substantially the same manner as the controller 1100 described with reference to FIG. 8, and configured to control the plurality of memory chips of the semiconductor memory device 2100 through the plurality of first to k-th channels CH1 to CHk.

Figure 12:
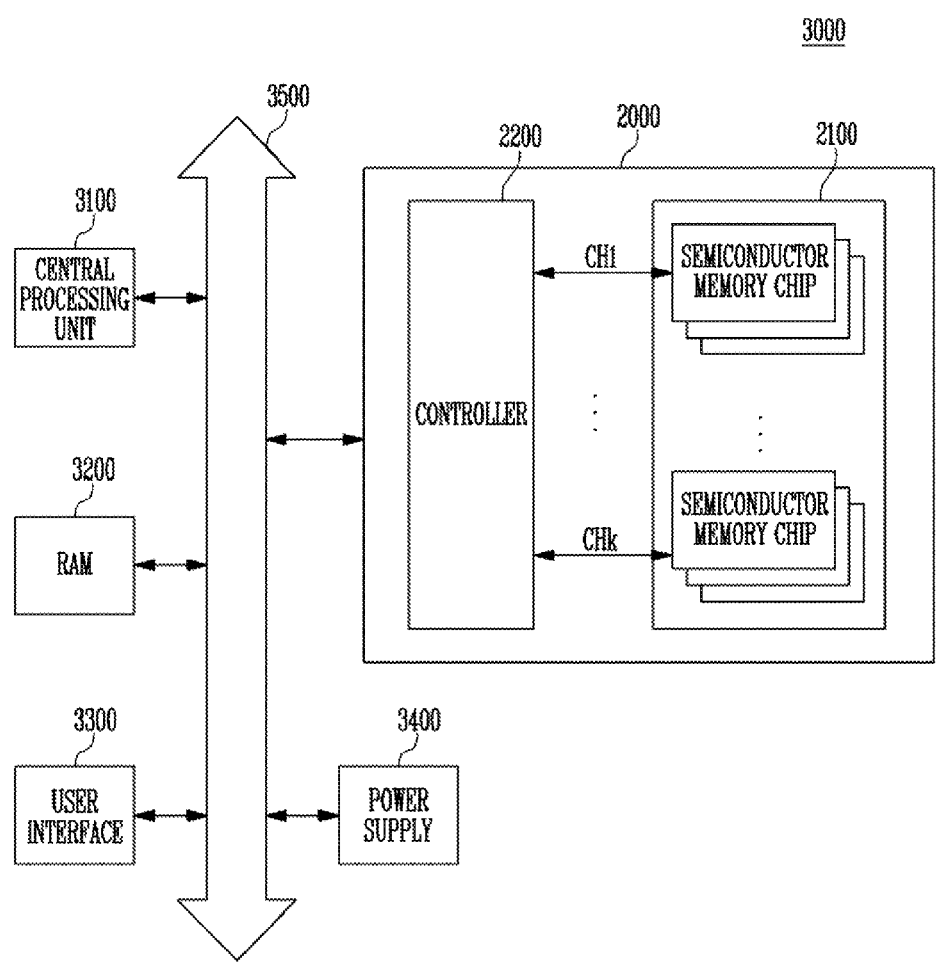
FIG. 12 is a block diagram illustrating a computing system including the memory system shown in FIG. 11, according to an embodiment of the invention.

FIG. 12 is a block diagram illustrating a computing system 3000 having the memory system described above with reference to FIG. 11, according to an embodiment of the invention.

Referring to FIG. 12, the computing system 3000 may include a central processing unit 3100, a random access memory (RAM) 3200, a user interface 3300 and a power supply 3400.

The memory system 2000 may be electrically connected to the central processing unit 3100, the RAM 3200, the user interface 3300 and the power supply 3400 through the system bus 3500. Data provided through the user interface 3300 or processed by the central processing unit 3100 may be stored in the memory system 2000.

As illustrated in FIG. 12, the semiconductor memory device 2100 may be coupled to the system bus 3500 through the controller 2200. However, the semiconductor memory device 2100 may be directly coupled to the system bus 3500. The central processing unit 3100 and the RAM 3200 may perform the functions of the controller 2200.

As illustrated in FIG. 12, the memory system 2000 shown in FIG. 11 may be included as the memory system 3000. However, the memory system 2000 may be replaced with the memory system 1000 described above with reference to FIG. 10. According to an embodiment, the computing system 3000 may include both of the memory systems 1000 and 2000 described above with reference to FIGS. 10 and 11, respectively.

According to embodiments, since a data output operation of a semiconductor memory device is performed using one of a plurality of address counters corresponding to respective memory banks, power consumption of the data output operation may be reduced.

It will be apparent to those skilled in the art that various modifications can be made to the above-described exemplary embodiments of the present invention without departing from the spirit and or scope of the invention. Thus, it is intended that the present invention cover all such modifications provided they come within the scope of the appended claims and their equivalents.

What is claimed is:

1. A semiconductor memory device, comprising:
 a first memory bank and a second memory bank;
 an address counter unit including:
  a first address counter suitable for outputting a first counting address signal corresponding to the first memory bank; and
  a second address counter suitable for outputting a second counting address signal corresponding to the second memory bank;
 a first output control unit suitable for generating first column address signals in response to the first counting address signal during a data input operation, and generating the first column address signals in response to the second counting address signal during a data output operation; and
 a second output control unit generating second column address signals in response to the second counting address signal during the data input operation and the data output operation,
 wherein the first address counter outputs the first counting address signal during the data input operation and is disabled during the data output operation, and the second address counter outputs the second counting address signal during the data input operation and the data output operation.

2. The semiconductor memory device of claim 1, further comprising: a column selection signal unit suitable for generating column selection signals in response to the first column address signals and the second column address signals; and
 a pipe latch control circuit suitable for generating pipe latch output signals during the data output operation.

3. The semiconductor memory device of claim 2,
 further comprising:
 a first page buffer unit and a second page buffer unit corresponding to the first memory bank and the second memory bank, respectively; and
 a data output circuit suitable for receiving the data stored in the first and second page buffer units and outputting the data to an input/output line,
 wherein the first and second page buffer units read data stored in the first and second memory banks, and store the data, respectively.

4. The semiconductor memory device of claim 3, wherein the first and second page buffer units transfer the data to the data output circuit in response to the column selection signals.

5. The semiconductor memory device of claim 3,
 wherein the data output circuit includes a plurality of pipe latches, and
 wherein the plurality of pipe latches output the data to the input/output line in response to the pipe latch output signals.

6. The semiconductor memory device of claim 1,
 further comprising a data path logic unit suitable for generating a first source clock and a second source clock in response to a data path enable signal,
 wherein the first address counter generates the first counting address signal based on the first source clock, and the second address counter generates the second counting address signal based on the second source clock.

7. The semiconductor memory device of claim 6, wherein the data path logic unit maintains and outputs the first source clock at a high logic level in response to a data output enable signal during the data output operation.

8. A semiconductor memory device, comprising:
 a memory cell array including a first memory bank and a second memory bank;
 a page buffer circuit suitable for reading data stored in the first and second memory banks and temporarily storing the data, and transferring the data to a data line in response to column selection signals;
 a data output circuit sensing the data transferred to the data line and storing the data, and transferring the data to an input/output line in response to pipe latch output signals; and
 a logic circuit including a first address counter and a second address counter corresponding to the first memory bank and the second memory bank, respectively, and suitable for generating the column selection signals based on a signal received from the second address counter during a data output operation.

9. The semiconductor memory device of claim 8, wherein the data output circuit further comprises:
   a sensing circuit suitable for sensing the data transferred to the data line; and
   a pipe latch circuit suitable for storing the sensed data and transferring the stored data to the input/output line in response to the pipe latch output signals.

10. The semiconductor memory device of claim 8,
   wherein the first address counter outputting a first counting address in response to a first source clock,
   wherein the second address counter suitable for outputting a second counting address in response to a second source clock,
   wherein the logic circuit further comprises:
   a first output control unit suitable for generating first column address signals in response to the first counting address and the second counting address;
   a second output control unit suitable for generating second column address signals in response to the second counting address; and
   a column selection signal generation unit suitable for generating the column selection signals in response to the first column address signals and the second column address signals.

11. The semiconductor memory device of claim 10, wherein the first address counter is disabled during the data output operation.

12. The semiconductor memory device of claim 10, wherein the first output control unit generates the first column address signals in response to the first counting address during a data input operation, and generates the first column address signals in response to the second counting address during the data output operation.

13. The semiconductor memory device of claim 10,
   wherein the logic circuit further comprises a data path logic unit suitable for generating the first source clock and the second source clock in response to a data path enable signal, and
   wherein the data path logic unit maintains the first source clock at a high logic level during the data output operation.

14. The semiconductor memory device of claim 10, wherein the logic circuit further comprises a pipe latch control circuit generating the pipe latch output signals in response to a data path enable signal.

15. The semiconductor memory device of claim 14, wherein the pipe latch control circuit sequentially outputs the pipe latch output signals during the data output operation when the first memory bank is a start memory bank for the data output operation.

16. The semiconductor memory device of claim 14, wherein when the second memory bank is a start memory bank for the data output operation, the pipe latch control circuit generates a first one among the pipe latch output signals, during a data prefetch operation prior to the data output operation and skips outputting garbage data stored in the data output circuit and corresponding to the first pipe latch output signal.

17. The semiconductor memory device of claim 14, wherein the pipe latch control circuit comprises:
   a clock generation unit suitable for generating a control clock having a predetermined cycle in response to a first signal; and
   a control signal generation unit suitable for generating the pipe latch output signals in response to the control clock.

18. The semiconductor memory device of claim 17, wherein the clock generation unit initializes the control clock to a high level in response to a reset signal during a data prefetch operation before the data output operation, and transitions the control clock to a low level to output the control clock transitioned to the low level in response to a second memory bank start signal and a reset delay signal obtained by delaying the reset signal by a predetermined amount of time.

19. The semiconductor memory device of claim 17, wherein the control signal generation unit outputs a first one among the pipe latch output signals in response to a control clock toggling during a data prefetch operation before the data output operation.

20. A method of operation of a semiconductor memory device comprising a first memory bank and a second memory bank, the method comprising:
   reading data stored in the first and second memory banks and temporarily storing the date in a page buffer circuit;
   outputting a first counting address signal corresponding to the first memory bank during a data input operation only and not during a data output operation;
   outputting a second counting address signal corresponding to the second memory bank;
   generating first column address signals in response to the first counting address signal during a data input operation or in response to the second counting address signal during a data output operation;
   generating second column address signals in response to the second counting address signal during the data input operation and the data output operation;
   generating column selection signals in response to the first and second column address signals; and
   transferring the data temporarily stored in the page buffer circuit to a data line in response to the column selection signals.

* * * * *